United States Patent [19]

Avellino et al.

[11] Patent Number: 5,189,275
[45] Date of Patent: Feb. 23, 1993

[54] PRINTED CIRCUIT ASSEMBLY WITH CONTACT DOT

[75] Inventors: Frank J. Avellino, Russell; Richard A. Case, Pittsfield; David T. Swanson, Warren, all of Pa.

[73] Assignee: GTE Products Corporation, Danvers, Mass.

[21] Appl. No.: 409,850

[22] Filed: Aug. 21, 1989

[51] Int. Cl.$^5$ ............... B23K 11/16; H01R 43/02
[52] U.S. Cl. ........................ 219/56.22; 29/846; 29/879
[58] Field of Search ............ 29/825, 846, 879, 860; 219/56.22, 56.1

[56] References Cited

U.S. PATENT DOCUMENTS

| | | | |
|---|---|---|---|
| 3,114,828 | 12/1963 | Gannoe | 219/103 |
| 3,257,707 | 6/1966 | Hotine et al. | 29/860 |
| 3,382,575 | 5/1968 | Gannoe | 29/603 |
| 3,803,711 | 4/1974 | Dubuc et al. | 29/879 |
| 4,403,411 | 9/1983 | Patton | 29/879 |

Primary Examiner—Bruce A. Reynolds
Attorney, Agent, or Firm—William H. McNeill

[57] ABSTRACT

A method of applying discrete areas of a noble metal to individual pads on a flexible printed circuit board comprises the steps of forming a particular pattern of electrically conductive material on a flexible, electrically insulating substrate. The pattern includes individual pads. An aperture is formed through the electrically insulating substrate to expose a portion of the underside of at least one of the individual pads, and then contacting the underside with an electrode, contacting the upper surface of the individual pad with a wire comprised of the noble metal, applying a welding current between the electrode and the wire to weld the wire to the pad and severing the wire to leave a particular amount on the upper surface of the pad.

10 Claims, 2 Drawing Sheets

PRINTED CIRCUIT ASSEMBLY WITH CONTACT DOT

TECHNICAL FIELD

This invention relates to printed circuit boards and more particularly to flexible printed circuit boards. Still more particularly, it relates to such boards having a contact dot or dots at particular locations thereon.

BACKGROUND ART

Printed circuit boards comprise electrically insulating substrates having electrically conductive patterns thereon. Additional components, such as transistors or integrated circuit devices may be mounted upon the boards. In use the boards are frequently mated with connectors having a plurality of contacts therein. To insure effective electricaL conductivity the conductive portions of the board and/or the contacting parts of the contacts are often gold plated. As regards the contacts in the connectors, it has been suggested that a gold dot be placed at the contact point. See, e.g., U.S. Pat. Nos. 3,114,828; 3,382,575; and 4,403,411. However, it has not previously been possible to provide such a discrete contact point on the printed circuit boards because of the insulating substrate and the fact that the discrete dots were applied by resistance welding, a technique made impossible by the insulating substrate.

SUMMARY OF THE INVENTION

It is therefore an object of the invention to obviate the disadvantages of the prior art.

It is another object of the invention to provide an enhanced method of fabricating printed circuit boards.

It is yet another object of the invention to provide a method of applying discrete amounts of contact material to specific areas of printed circuit board pads.

Still another object is the provision of such a method that is economical.

These objects are accomplished, in one aspect of the invention, by the provision of a method of applying discrete areas of a noble metal to individual pads on a printed circuit board comprising the steps of forming a particular pattern of electrically conductive material on an electrically insulating substrate, said pattern including individual pads. Thereafter, forming an aperture through the electrically insulating substrate to expose a portion of the underside of at least one of the individual pads; contacting the underside with an electrode; contacting the upper surface of said individual pad with a wire comprised of the noble metal; applying a welding current between the electrode and the wire to weld the wire to the pad; and severing the wire to leave a particular amount thereof on the upper surface of the pad.

Employment of this method provides printed circuit boards with contact areas having discrete dots of a noble metal material, providing greatly increased wear resistance. The process is economical and easy to use.

BEST MODE FOR CARRYING OUT THE INVENTION

For a better understanding of the present invention, together with other and further objects, advantages and capabilities thereof, reference is made to the following disclosure and appended claims in conjunction with the above-described drawings, which are for example and not limitation.

Figure 1:
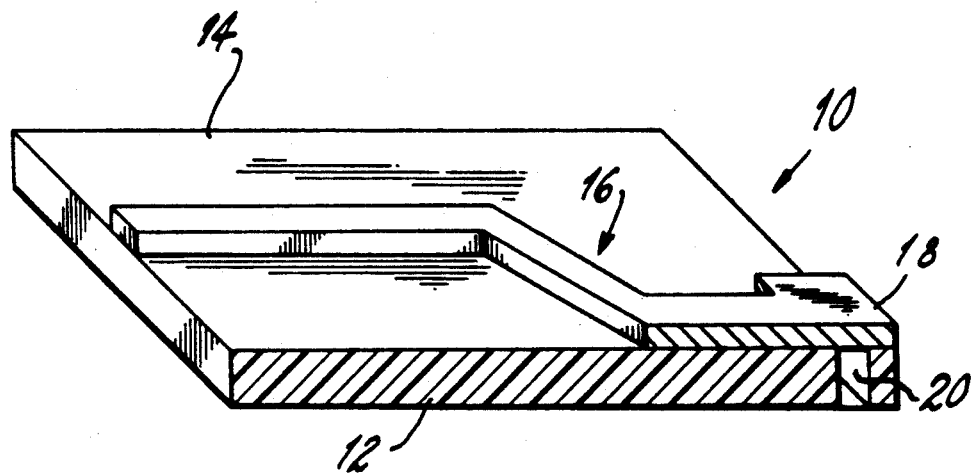
FIG. 1 is a perspective view, partially in section, of a printed circuit board prepared for use with the invention.
Figure 2:
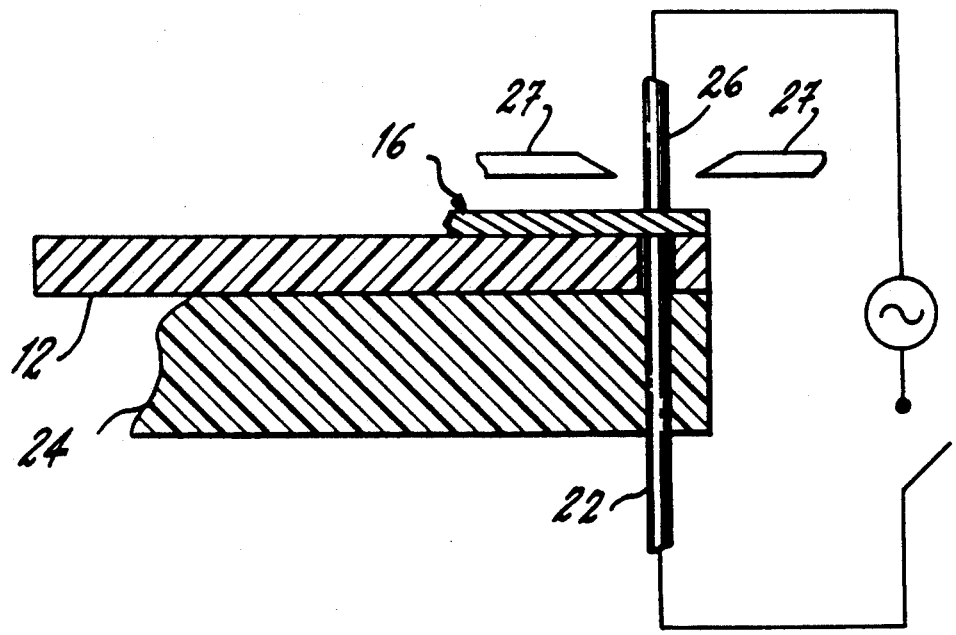
FIG. 2 is sectional view of a step in the process.

Referring now to the drawings with greater particularity, there is shown in FIG. 1 a printed circuit board 10 having an electrically insulating substrate 12, which can be flexible or relatively rigid. At least the upper surface 14 of the substrate 12 has thereon an electrically conductive pattern 16 of, for example a copper foil. The copper can have thereon a layer of tin or solder. At least one portion of the conductor is provided with a pad 18 on which it is desired to attach a noble metal contact dot. The noble metal can be gold or silver or, preferrably, an alloy of gold and silver having a gold content of 70% with the remainder silver.

Figure 3:
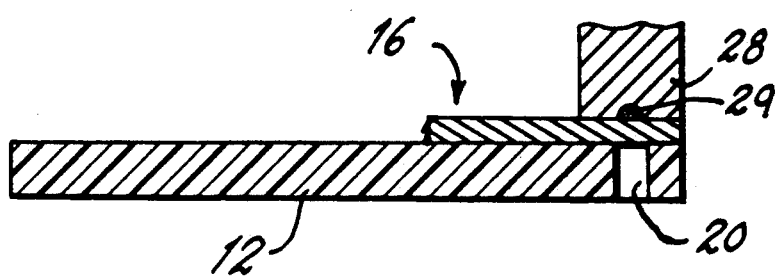
FIG. 3 is a sectional view of an additional step in the process.
Figure 4:
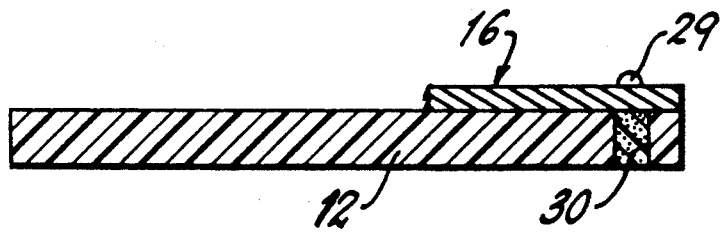
FIG. 4 is a sectional view of the finished board.

An aperture 20 is provided in board 10, through the insulating substrate 12, at a position opposite the pad 18. The board 10 is then indexed to position over an electrode 22, which can be mounted in an insulating base 24. The electrode 22 contacts the underside of the pad 18. A wire 26 of the noble metal is applied to the upper surface of pad 18 and a welding current is applied between the electrode and the wire to affix the wire to the pad. Cutting blades 27 are then activated to sever the wire. The wire 29 that remains on pad 18 is then coined by a coining die 28 (FIG. 3), and the aperture 20 is subsequently filled with an electrically insulating material 30 to complete the operation.

The mechanics of the wire welding operation are known in the art as shown by U.S. Pat. Nos. 3,114,828 and 3,382,575, the teachings of which are hereby incorporated by reference.

It will thus be seen that utilization of this method allows the formation of discrete noble metal contact dots on printed circuit boards and allows the matchless advantage of the contact dot technology to be applied thereto.

While there have been shown what are at present considered to be the preferred embodiments of the invention, it will be apparent to those skilled in the art that various changes and modifications can be made herein without departing from the scope of the invention as defined by the appended claims.

We claim:

1. A method of applying discrete areas of a noble metal to individual pads on a flexible printed circuit board comprising the steps of:
   (a) forming a particular pattern of electrically conductive material on a flexible, electrically insulating substrate, said pattern including individual pads;
   (b) forming an aperture through said electrically insulating substrate to expose a portion of the underside of at least one of said individual pads;
   (c) contacting said underside with an electrode;
   (d) contacting the upper surface of said individual pad with a wire comprised of said noble metal;
   (e) applying a welding current between said electrode and said wire to weld said wire to said pad; and
   (f) severing said wire to leave a particular amount on said upper surface of said pad.

2. The method of claim 1 wherein said severed portion of said wire is coined.

3. The method of claim 2 wherein said aperture is subsequently sealed with an electrically insulating substance.

4. The method of claim 3 wherein said noble metal is an alloy of gold and silver.

5. The method of claim 4 wherein said noble metal comprises 70% gold.

6. A method of applying discrete areas of a noble metal to individual pads on a printed circuit board comprising the steps of:

(a) forming a particular pattern of electrically conductive material on an electrically insulating substrate, said pattern including individual pads;

(b) forming an aperture through said electrically insulating substrate to expose a portion of the underside of at least one of said individual pads;

(c) contacting said underside with an electrode;

(d) contacting the upper surface of said individual pad with a wire comprised of said noble metal;

(e) applying a welding current between said electrode and said wire to weld said wire to said pad; and (f) severing said wire to leave a particular amount on said upper surface of said pad.

7. The method of claim 6 wherein said severed portion of said wire is coined.

8. The method of claim 7 wherein said aperture is subsequently sealed with an electrically insulating substance.

9. The method of claim 8 wherein said noble metal is an alloy of gold and silver.

10. The method of claim 9 wherein said noble metal comprises 70% gold.

* * * * *